US012032050B2

United States Patent
Shirai et al.

(10) Patent No.: US 12,032,050 B2
(45) Date of Patent: Jul. 9, 2024

(54) MAGNETIC RESONANCE IMAGING APPARATUS, SENSITIVITY DISTRIBUTION CALCULATION METHOD, AND SENSITIVITY DISTRIBUTION CALCULATION PROGRAM

(71) Applicant: Hitachi, Ltd., Tokyo (JP)

(72) Inventors: Toru Shirai, Tokyo (JP); Yasuhiro Kamada, Tokyo (JP); Masahiro Takizawa, Tokyo (JP); Hisaaki Ochi, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 378 days.

(21) Appl. No.: 16/771,449

(22) PCT Filed: Sep. 13, 2018

(86) PCT No.: PCT/JP2018/034007
§ 371 (c)(1),
(2) Date: Jun. 10, 2020

(87) PCT Pub. No.: WO2019/181006
PCT Pub. Date: Sep. 26, 2019

(65) Prior Publication Data
US 2021/0068700 A1 Mar. 11, 2021

(30) Foreign Application Priority Data
Mar. 20, 2018 (JP) .................................. 2018-053210

(51) Int. Cl.
*G01R 33/56* (2006.01)
*G01R 33/34* (2006.01)
(Continued)

(52) U.S. Cl.
CPC .......... *G01R 33/5611* (2013.01); *G01R 33/34* (2013.01); *G01R 33/4822* (2013.01); *G01R 33/54* (2013.01)

(58) Field of Classification Search
CPC ........................... G01R 33/5612; G01R 33/11
See application file for complete search history.

(56) References Cited

U.S. PATENT DOCUMENTS 6,680,610 B1 1/2004 Kyriakos et al.
2008/0197844 A1 8/2008 Ying et al.
(Continued)

FOREIGN PATENT DOCUMENTS

CN 1649540 A 8/2005
CN 101105522 A 1/2008
(Continued)

OTHER PUBLICATIONS

International Preliminary Report on Patentability received in corresponding International Application No. PCT/JP2018/034007 dated Sep. 22, 2020.
(Continued)

*Primary Examiner* — Rajeev P Siripurapu
(74) *Attorney, Agent, or Firm* — MATTINGLY & MALUR, PC

(57) ABSTRACT

To calculate a high-resolution coil sensitivity distribution that does not depend on a shape or a structure of a subject with high accuracy. An MRI apparatus of the invention includes: a measurement unit that includes a reception coil including a plurality of channels, a measurement unit that measures a nuclear magnetic resonance signal of a subject for every channel of the reception coil; and an image computation unit that creates an image of the subject by using a sensitivity distribution for every channel of the reception coil, and a channel image obtained from the
(Continued)

nuclear magnetic resonance signal measured by the measurement unit for every channel. The image computation unit includes a sensitivity distribution calculation unit that calculates a sensitivity distribution on a k-space for every channel by using the channel images and a composite image obtained by combining the channel images.

10 Claims, 12 Drawing Sheets

(51) Int. Cl.
   *G01R 33/48* (2006.01)
   *G01R 33/54* (2006.01)
   *G01R 33/561* (2006.01)

(56) References Cited

U.S. PATENT DOCUMENTS

| 2011/0148410 | A1* | 6/2011 | Zaitsev | G01R 33/5611 |
| | | | | 324/309 |
| 2014/0197835 | A1 | 7/2014 | Kamada et al. | |
| 2016/0097831 | A1* | 4/2016 | Dannels | G01R 33/385 |
| | | | | 324/318 |
| 2016/0313416 | A1 | 10/2016 | Nielsen | |

FOREIGN PATENT DOCUMENTS

| CN | 105874346 A | 8/2016 |
| EP | 2 581 756 A1 | 4/2013 |
| JP | 2004344327 A | 12/2004 |
| JP | 2007-14813 A | 1/2007 |
| JP | 2007-260425 A | 10/2007 |
| JP | 2008-67830 A | 3/2008 |
| JP | 2008-99717 A | 5/2008 |
| JP | 2011031058 A | 2/2011 |
| JP | 2017502727 A | 1/2017 |
| WO | 01/41639 A1 | 6/2001 |
| WO | 2013047275 A1 | 4/2013 |

OTHER PUBLICATIONS

Klaas P. Pruessmann et al., "SENSE: Sensitivity Encoding for Fast MRI", Magnetic Resonance in Medicine 42, 1999, pp. 952-962.

Martin Uecker et al., "ESPIRit—An Eigenvalue Approach to Autocalibrating Parallel MRI: Where SENSE Meets GRAPPA", Magnetic Resonance in Medicine 71, 2014, pp. 990-1001.

International Search Report of PCT/JP2018/034007 dated Dec. 18, 2018.

Chinese Office Action received in corresponding Chinese Application No. 201880071774.X dated May 17, 2023.

Tai, H. et al., "Simultaneous Multi-slice Acquisition Using a Parallel MR Imaging System" Proceedings of the 2005 IEEE Engineering in Medicine and Biology 27th Annual Conference, Sep. 1-4, 2005, pp. 1652-1655.

Min, H. et al., "Technology and Reconstruction of MRSI Based on Sensitivity Encoding" Beijing Biomedical Engineering, Sep. 2004, pp. 171-174, vol. 23, No. 3.

Chinese Office Action received in corresponding Chinese Application No. 201880071774.X dated Aug. 2, 2023.

* cited by examiner

FIG. 11
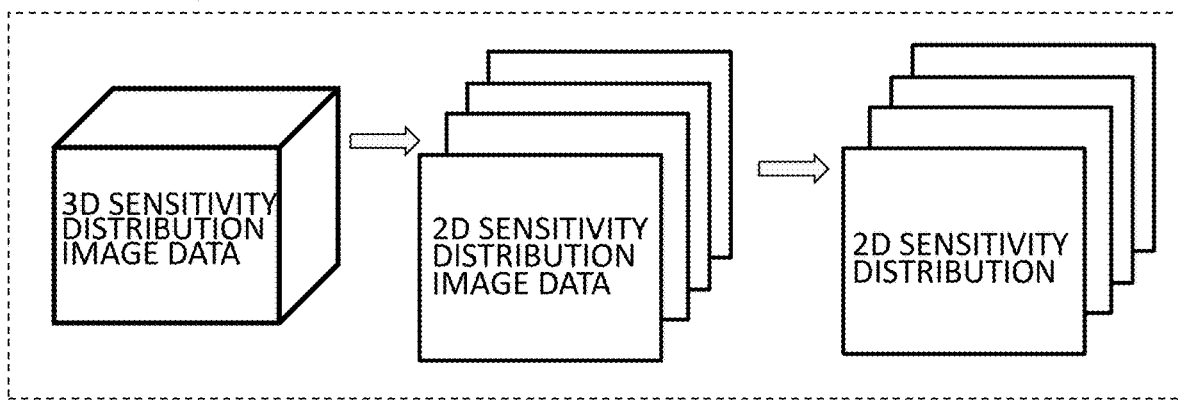
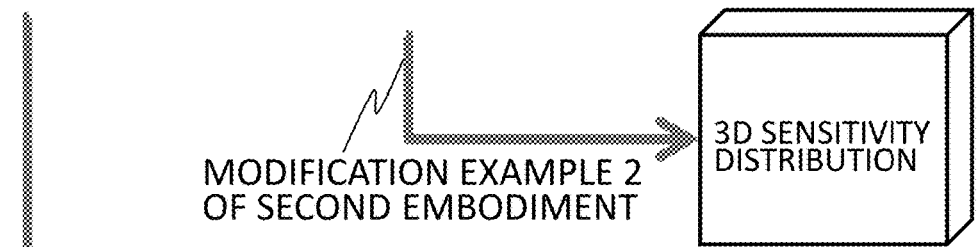
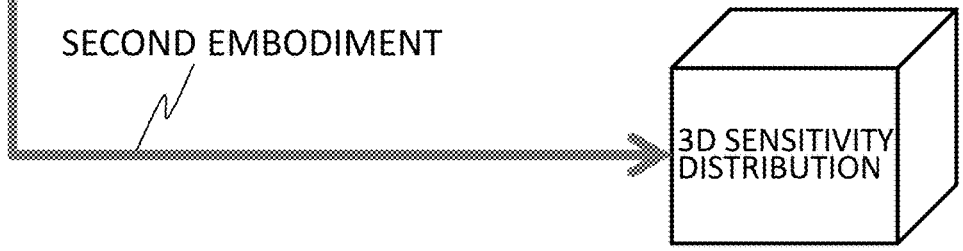
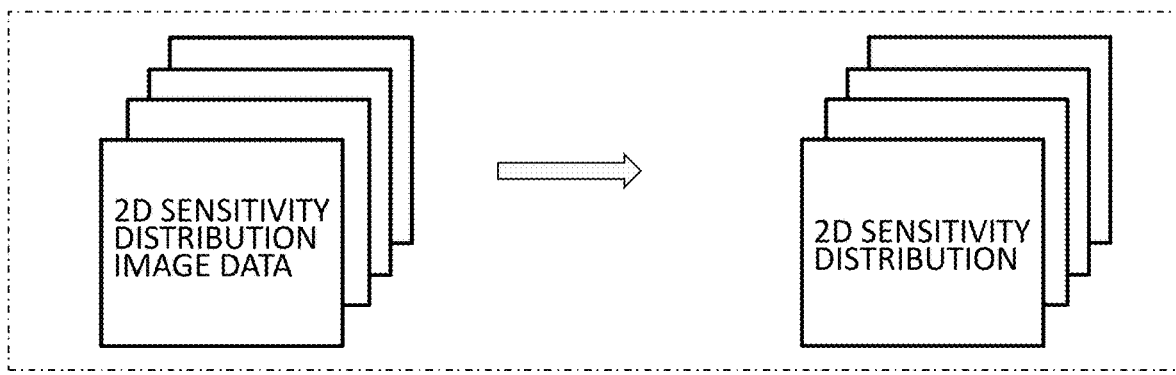
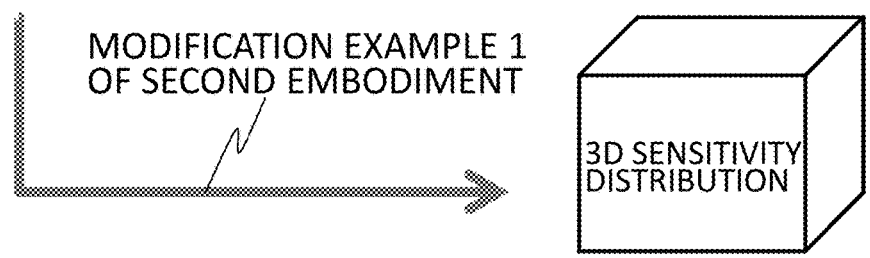

MAGNETIC RESONANCE IMAGING APPARATUS, SENSITIVITY DISTRIBUTION CALCULATION METHOD, AND SENSITIVITY DISTRIBUTION CALCULATION PROGRAM

TECHNICAL FIELD

The present invention relates to a magnetic resonance imaging apparatus (hereinafter, referred to as "MRI" apparatus) that acquires an image of an examination target by using nuclear magnetic resonance, and particularly to, a technology of calculating a sensitivity distribution of a reception coil that receives a nuclear magnetic resonance signal.

BACKGROUND ART

In the MRI apparatus, a reception coil receives a signal generated by the nuclear magnetic resonance from a subject placed in a static magnetic field, and the signal is processed to acquire the image of the subject. Typically, reception coil sensitivity is not uniform, and a sensitivity distribution exists. When the sensitivity distribution exists, shading occurs in an image, and thus an influence of the sensitivity distribution is removed through correction in the related art.

On the other hand, in a recent MRI, a method (parallel imaging) of performing high-speed imaging with a plurality of reception coils different in the sensitivity distribution by using a situation in which the sensitivity distribution is different depending on the reception coil is widely employed. The parallel imaging is an imaging method in which k-space data is thinned out and is measured, a non-measurement point is restored by computation using sensitivity distributions of the plurality of reception coils, and an image without aliasing is obtained, and there are suggested various methods in which measurement methods or signal restoring methods are different from each other. As a representative method, there is suggested a method (an SMASH method or a GRAPPA method) in which measurement is performed by thinning out a k-space, non-measurement data is estimated by computation on a measurement space (k-space), and k-space data fully filled with data is created in order for the aliasing not to occur, or a method (SENSE method) in which the aliasing that occurs in an image reconfigured from the k-space data is developed by computation on an actual space to obtain an image without aliasing (Non-Patent Document 1). In addition, there is also suggested a method (simultaneous multislice (SMS) method) in which a plurality of slices are simultaneously excited, and signals from the plurality of slices are separated on an actual space.

In the image reconfiguration in which signal separation is performed in the actual space, accuracy of a coil sensitivity distribution used in computation has a great influence on an image quality of a finally obtained image, and thus it is necessary to obtain the coil sensitivity distribution with high accuracy. Accordingly, there is suggested a method in which a low-resolution sensitivity distribution calculation image is acquired by prescanning in the presence of a subject, a coil sensitivity distribution is calculated from the image, the calculated low-resolution sensitivity distribution is interpolated and enlarged or extrapolation of a non-signal/low-signal region is performed to obtain a high-resolution sensitivity distribution (Patent Document 1).

CITATION LIST

Non-Patent Document

Non-Patent Document 1: Klaas P. Pruessmann, et al. Magnetic Resonance in Medicine 42: 952-962 (1999)

Patent Document

Patent Document 1: JP-A-2004-344327

SUMMARY OF THE INVENTION

Technical Problem

In the sensitivity distribution calculation method as described above, there is a problem that accuracy of the interpolation or the extrapolation processing decreases in accordance with a shape of a subject. The reason for this is because a shape or a structure of a subject reflects on a luminance value of pixels constituting an image, and with regard a sensitivity distribution calculated by the image constituted by the luminance value of the pixels includes elements depending on the shape or the structure of the subject in addition to the sensitivity distribution of the reception coil itself.

Here, an object of the invention is to calculate a coil sensitivity distribution that does not depend on a shape or a structure of a subject with high accuracy, and to improve an image quality of a captured image in parallel imaging using the coil sensitivity distribution.

Solution to Problem

To accomplish the above-described object, according to an aspect of the invention, coil sensitivity distribution frequency components are obtained by computation on a k-space, and a coil sensitivity distribution as actual space data is calculated by using the frequency components. The k-space frequency components are obtained as frequency components common to respective positions of the k-space, and thus a sensitivity distribution that does not depend on a shape or a structure of the subject is obtained.

That is, an MRI apparatus of the invention includes: a measurement unit that includes a reception coil having a plurality of channels, and measures a nuclear magnetic resonance signal of a subject for every channel of the reception coil; and an image computation unit that creates an image of the subject by using a sensitivity distribution for every channel of the reception coil, and a channel image obtained from the nuclear magnetic resonance signal measured by the measurement unit for every channel. The image computation unit includes a sensitivity distribution calculation unit that calculates a sensitivity distribution on a k-space for every channel by using the channel images and a composite image obtained by combining the channel images.

Advantageous Effects of the Invention

According to the invention, it is possible to obtain a high-accuracy sensitivity distribution that does not depend on a shape or a structure of a subject. According to this, it is possible to obtain an image with accuracy in an imaging method such as parallel imaging using a coil sensitivity distribution.

BRIEF DESCRIPTION OF THE DRAWINGS

FIG. 11 is a view illustrating an overview of processing in first and second embodiments, and a modification example thereof.

MODE FOR CARRYING OUT THE INVENTION

Hereinafter, embodiments of an MRI apparatus of the invention will be described with reference to the accompanying drawings.

Embodiment of Apparatus

First, an embodiment of an MRI apparatus common to respective embodiments will be described.

Figure 1:
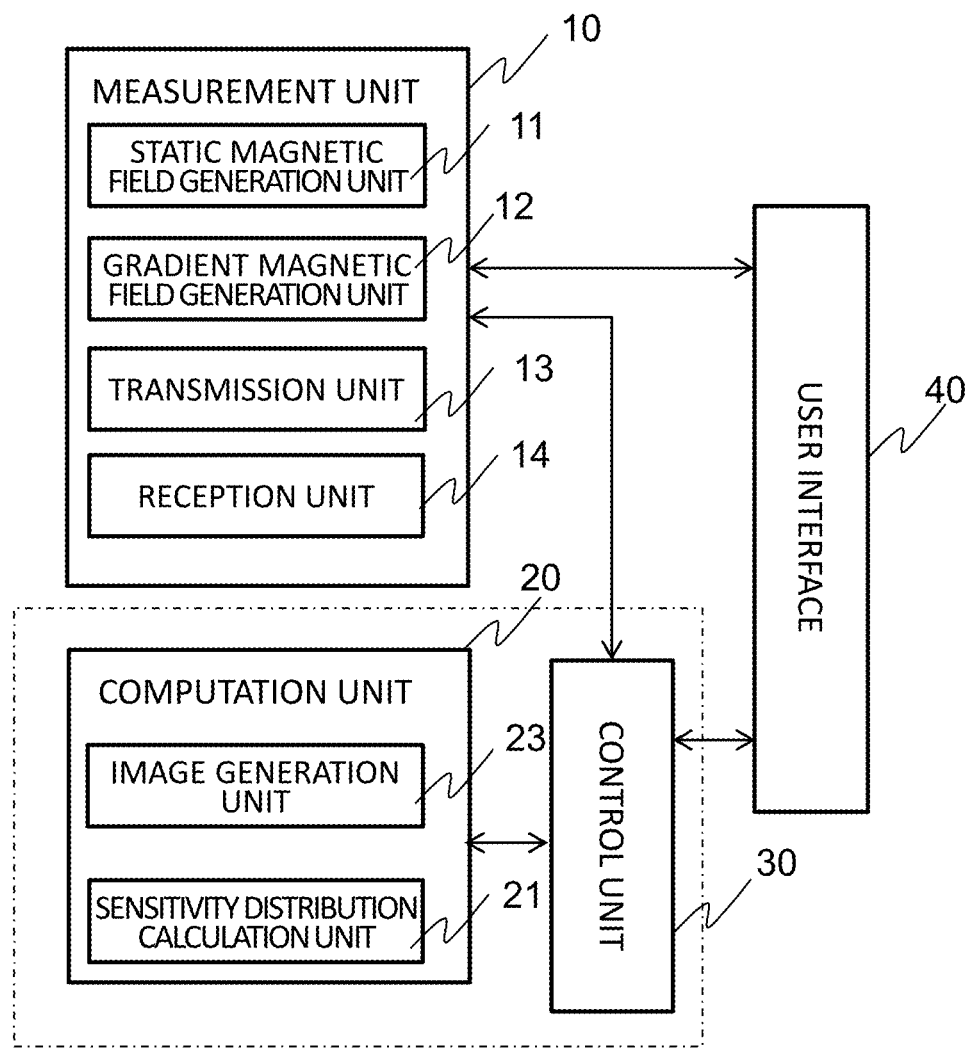
FIG. 1 is a functional block diagram of an MRI apparatus.

As illustrated in FIG. 1, the MRI apparatus of this embodiment includes a measurement unit 10 that acquires a nuclear magnetic resonance signal, a computation unit (image computation unit) 20 that performs computation such as image reconfiguration by using the nuclear magnetic resonance signal (hereinafter, referred to as "MR signal") acquired by the measurement unit, and a control unit 30 that controls operations of respective units such as the measurement unit 10 and the computation unit 20 which constitute the MRI apparatus. The control unit 30 may be a part of a function of the computation unit 20. In addition, the MRI apparatus can include a user interface device 40 including a device for inputting imaging initiation/termination, an imaging condition setting command, or the like to the measurement unit 10 or the control unit 30 by a user, or for presenting a processing result of the computation unit 20 to the user.

The measurement unit 10 includes a static magnetic field generation unit 11 that has a similar configuration as in a typical MRI apparatus and generates a uniform magnetic field in a space in which a subject is placed, a gradient magnetic field generation unit 12 that provides a magnetic field gradient to the static magnetic field, a transmission unit 13 that emits a high-frequency magnetic field pulse (hereinafter, referred to as "RF pulse") for exciting an atomic nucleus, typically, a proton of an atom that constitutes a tissue of a subject, and a reception unit 14 that receives a nuclear magnetic resonance signal that is generated from the subject. Specifically, as illustrated in FIG. 2, a static magnetic field coil 102, a shim coil 104 that corrects magnetic field uniformity of the static magnetic field coil 102 and a power supply unit 113 of the shim coil 104 as the static magnetic field generation unit 11, a gradient magnetic field coil 103 and the power supply unit 113 thereof as the gradient magnetic field generation unit 12, a transmission coil 105 and a transmitter 107 that transmits an RF signal to the transmission coil 105 as the transmission unit 13, a reception coil 106 and a receiver 108 that detects an MR signal received by the reception coil 106 as the reception unit are provided.

The static magnetic field generation unit 11 can use a static magnetic field coil 102 of a normal conducting magnet type or a superconducting magnet type, or a permanent magnet. In addition, a vertical magnetic field type, a horizontal magnetic field type, or a type in which a magnetic field direction is inclined with respect to a horizontal direction, and the like exist in accordance with the magnetic field direction, and any one of these may be employed.

Figure 2:
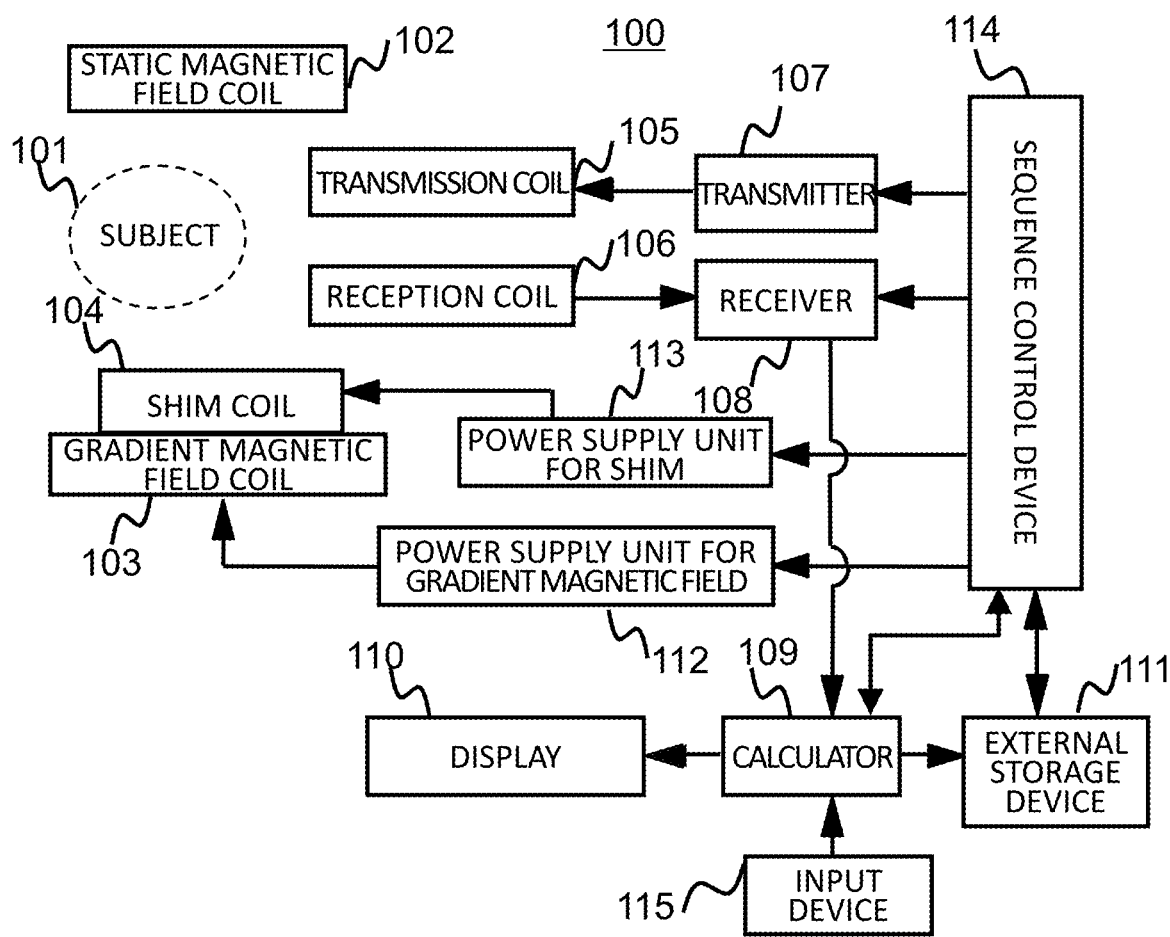
FIG. 2 is a view illustrating an overall configuration of an MRI apparatus of an embodiment.

Although illustrated by one block in FIG. 2, the gradient magnetic field coil 103 includes three gradient magnetic field coils in three axial directions orthogonal to each other, and the three gradient magnetic field coils are connected to each of the power supply units 112, respectively. An excitation region of a subject can be selected or position information can be applied to an MR signal through application of a gradient magnetic field of respective axes.

The transmission coil 105 is typically fixed in a static magnetic field space in combination with the shim coil 104 and the gradient magnetic field coil 103.

Although illustrated by one block in FIG. 2, the reception coil 106 includes a reception coil including a plurality of channels, and has a function of performing reception for every channel. As the reception coil having the plurality of channel, a plurality of known channels such as reception coil in which sub-coils corresponding to respective channels are combined, and a reception coil in which a plurality of loop coils are arranged in a predetermined arrangement can be used, and here, the sub-coil or the loop coils correspond to individual reception coils.

Under control of the control unit 30, the measurement unit 10 causes the transmission coil 105 and the gradient magnetic field coil 103 to operate in accordance with imaging conditions designated by a user and a predetermined pulse sequence to irradiate a subject 101 in a static magnetic field with an RF pulse, and the reception coil 106 receives an MR signal that is generated from the subject due to the irradiation. In the control by the control unit 30, control on the measurement unit 10 by the pulse sequence is realized by a sequence control device 114.

The computation unit 20 includes a sensitivity distribution calculation unit 21 that calculates a sensitivity distribution of the reception coil by using a nuclear magnetic resonance signal measured by the measurement unit 10, and an image generation unit 23 that generates an image by using the sensitivity distribution calculated by the sensitivity distribution calculation unit 21 and k-space data that is measurement data. For example, the function of the computation unit 20 can be realized by mounting and executing a program that defines a procedure of sensitivity distribution calculation or image generation in a calculator including a CPU or a GPU, and a memory. However, a part or the entirety of computation may be configured by hardware such as an application specific integrated circuit (ASIC) and a field programmable gate array (FPGA), or may be realized by a calculator different from the MRI apparatus or a computation unit on a cloud.

The control unit 30 includes the sequence control device 114 controls the measurement unit 10 in accordance with a predetermined pulse sequence, and controls operations of the measurement unit 10 and the computation unit 20. In a case where the computation unit 20 is realized by a CPU of the calculator, a part or the entirety of the function may be realized by mounting a control program in the same CPU, or a part or the entirety of the function may be realized by another CPU or hardware.

In the configuration illustrated in FIG. 2, the functions of the computation unit 20 and the control unit 30 which are realized by software are provided in a calculator 109, and a display 110 and an input device 115 which become the user interface device 40, an external storage device 111, and the like are connected to the calculator 109.

The MRI apparatus of this embodiment is characterized in that the computation unit (the sensitivity distribution calculation unit 21) 20 obtains coil sensitivity distribution frequency components through computation on a k-space, and the coil sensitivity distribution as actual space data is calculated by using the frequency components. An imaging method executed by the measurement unit 10 can employ a known MRI technology unless otherwise stated, and as a method of generating an image by the image generation unit 23, a type of images to be generated, and the like, a known method or a known type that corresponds to the imaging method can be employed.

Hereinafter, an embodiment of a sensitivity distribution calculation method will be described with focus given to the function of the sensitivity distribution calculation unit 21. The functions of the measurement unit 10 and the image generation unit 23 will be noted as necessary.

First Embodiment

In this embodiment, an operation of the MRI apparatus will be described with reference to an example of parallel imaging in which high-speed imaging is performed by using a difference in a sensitivity distribution of a plurality of reception coils. In addition, as an example, description will be given of a case where a two-dimensional (2D) sensitivity distribution is calculated by using data obtained by a three-dimensional (3D) sensitivity distribution sequence.

Figure 3:
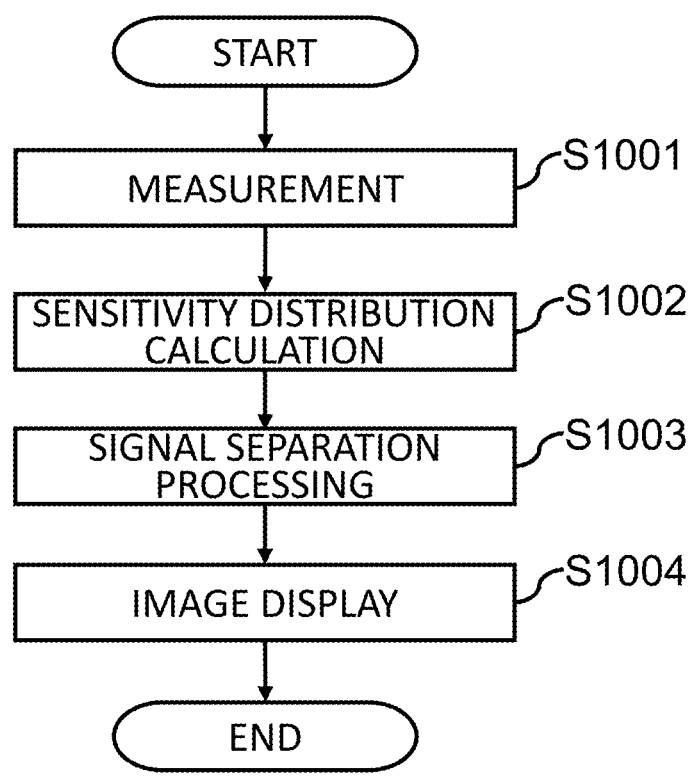
FIG. 3 is a view illustrating an imaging procedure in a first embodiment.

As illustrated in FIG. 3, imaging in the parallel imaging includes respective steps of measurement (S1001), sensitivity distribution calculation (S1002), signal separation processing (S1003), and image display (S1004). Hereinafter, the respective steps will be described in detail.

[Measurement Step S1001]

In the measurement step S1001, the measurement unit 10 executes an imaging sequence including a pulse sequence for acquiring a subject image (hereinafter, referred to as "main imaging sequence"), and a pulse sequence for acquiring a sensitivity distribution image (hereinafter, referred to as "sensitivity distribution sequence"). A type of the pulse sequence is not particularly limited, and in FIG. 4, a pulse sequence 400 of a typical 3D-gradient echo (GrE) method is illustrated as an example of the sensitivity distribution sequence. In the drawing, RF represents irradiation timing of a high-frequency magnetic field pulse 402 and reception timing of a nuclear magnetic resonance signal 407, and Gs, Gp, and Gr illustrates polarity/intensity of gradient magnetic field pulses in three-axial directions orthogonal to each other, and application timing in this order from an upper side. With regard to a three-digit number, the same three-digit number indicates the same type of pulse, and with regard to a number following a hyphen after the three-digit number, the same number indicates a pulse that is applied in the same repetition time. In addition, Gs indicates a slice selection gradient magnetic field, Gp indicates a phase encode gradient magnetic field, Gr indicates a read-out gradient magnetic field, a vertical arrow beside a pulse indicates that gradient magnetic field strength varies for every repetition of a pulse sequence.

Figure 4:
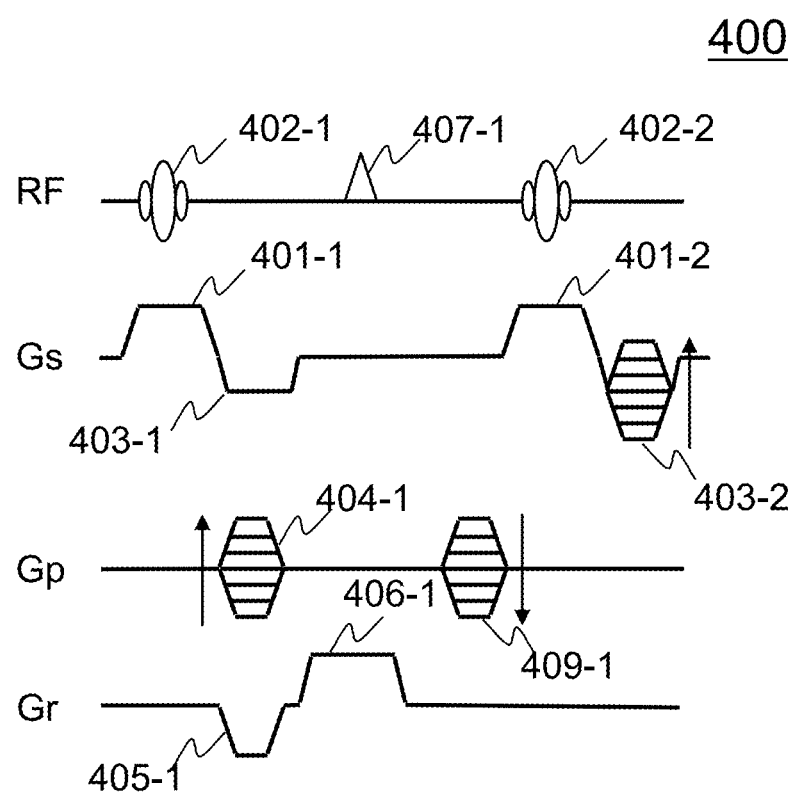
FIG. 4 is a view illustrating an example of a sensitivity distribution calculation pulse sequence in the first embodiment.

In the imaging sequence in FIG. 4, first, the RF pulse 402 and a slice selection gradient magnetic field 401 are applied to excite a predetermined region, and then a rephase pulse 403 of the slice gradient magnetic field Gs and a phase encode pulse 404 are applied. At this time, a diphase pulse 405 of the read-out gradient magnetic field Gr is applied, and the nuclear magnetic resonance signal 407 is sampled while applying a rephase pulse in which a polarity is inverted from that of the diphase pulse 405. Finally, a rephase pulse 409 is applied in a phase encode direction. The application of the RF pulse 402 to the application of the rephase pulse 409 are repeated in a predetermined repetition time TR to collect a nuclear magnetic resonance signal necessary for image reconfiguration. Digital data of the sampled nuclear magnetic resonance signal becomes k-space data. In the sequence, 3D-data is obtained.

The main imaging sequence and the sensitivity distribution sequence may be the same as each other or may be different from each other, but in the case of the sensitivity distribution sequence, the number of encode steps is small in both slice encode and phase encode, and a low-resolution sensitivity distribution image is acquired. According to this, in the case of executing the sensitivity distribution sequence as pre-scan different from the main imaging sequence, it is possible to suppress measurement time necessary for the pre-scan to a short time. However, resolution or a field of view (FOV) of the low-resolution sensitivity distribution does not match those of an image of high-resolution main imaging. Accordingly, to apply a coil sensitivity distribution to image reconfiguration, in sensitivity distribution calculation processing to be described later, processing of making the coil sensitivity distribution match an image of main imaging.

[Sensitivity Distribution Calculation Step S1002]

In a sensitivity distribution calculation step S1002, the sensitivity distribution calculation unit 21 calculates a coil sensitivity distribution to be applied to an image (target image) of main imaging by using sensitivity distribution data (hereinafter, referred to as "Smap data") collected by the measurement unit 10. In this embodiment, parallel imaging is performed, and thus the coil sensitivity distribution is calculated for each of the plurality of reception coils (channels).

Figure 5:
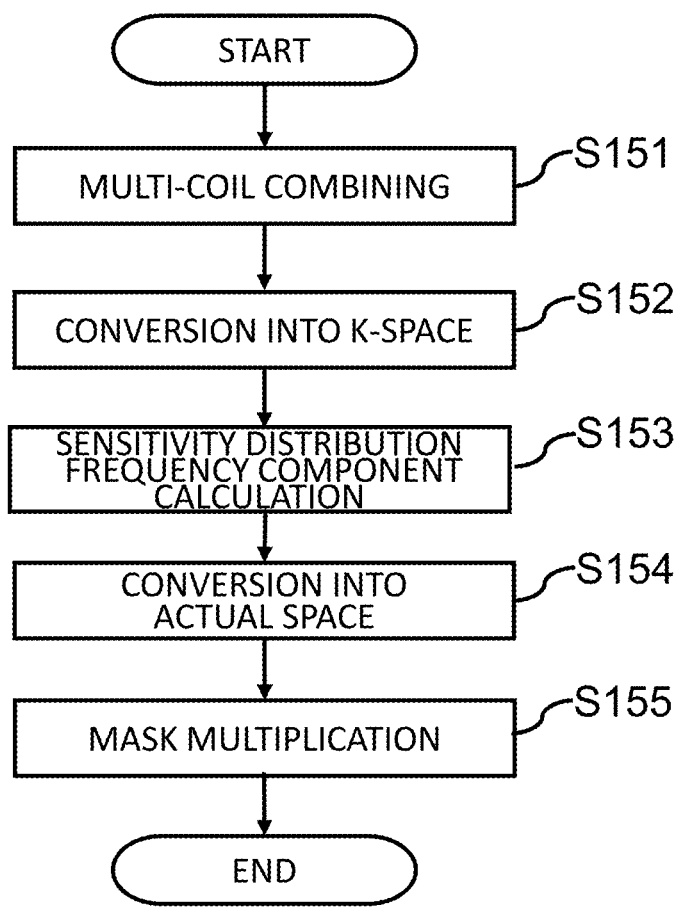
FIG. 5 is a view illustrating a sensitivity distribution calculation procedure.
Figure 6:
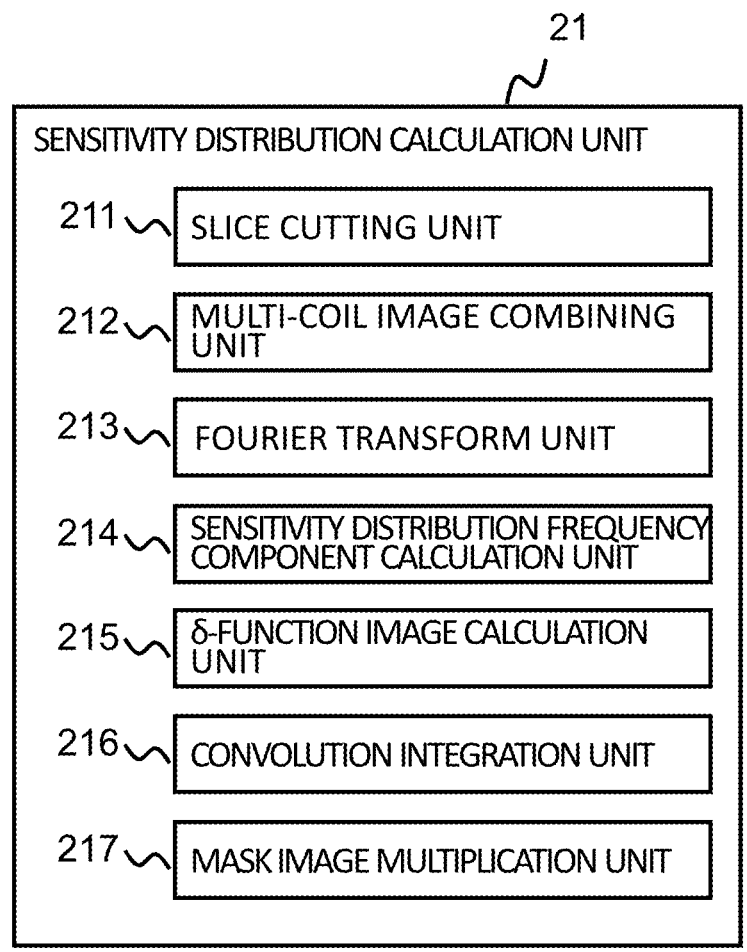
FIG. 6 is a functional block diagram of a sensitivity distribution calculation unit.

Details of the sensitivity distribution calculation step S1002 are illustrated in FIG. 5. Sensitivity distribution calculation mainly includes combining of sensitivity distributions (pieces of image space data) of respective reception coils (S151), conversion of a composite sensitivity distribution into k-space data (S152), frequency component calculation of respective reception coils by using the k-space data (S153), and conversion of sensitivity distribution frequency components (k-space) into actual space data (S154), and includes processing of multiplying a mask image as necessary (S155). To realize the processing, for example, as illustrated in a functional block diagram in FIG. 6, the sensitivity distribution calculation unit 21 includes a slice cutting unit 211, a multi-coil image combining unit 212, a fourier transform unit 213, a sensitivity distribution frequency component calculation unit 214, a δ-function image calculation unit 215, a convolution integration unit 216, and a mask image multiplication unit 217. FIG. 6 is an example of the sensitivity distribution calculation unit 21, and a part of the functional units may be appropriately omitted, or other functional units may be added. Hereinafter, as operations of respective units, details of processing performed by the sensitivity distribution calculation unit 21 will be described.

(Combining Processing S151)

Figure 7:
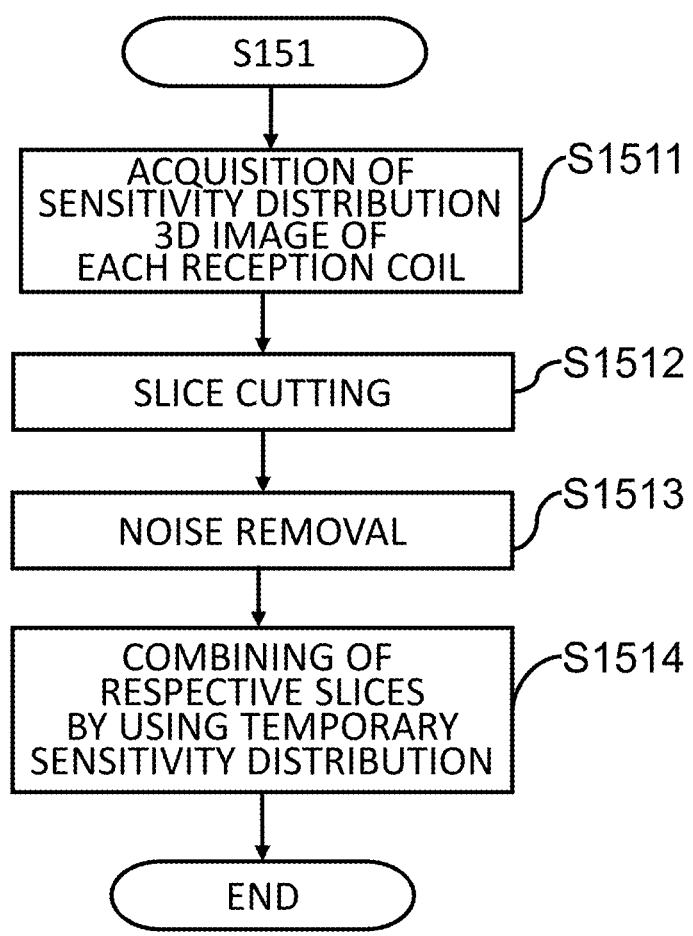
FIG. 7 is a view illustrating details of a multi-coil combining step in a flow illustrated in FIG. 5.

Details of combining processing S151 are illustrated in FIG. 7.

In the combining processing S151, first, the fourier transform unit 213 performs fourier transform on 3D-Smap data to convert k-space data into image data (actual space data) (S1511), the slice cutting unit 211 cuts out 2D image data (slice) from 3D-Smap image data that is the actual space data (S1512). At this time, the Smap image data of the cut-out slice is cut out so that an FOV becomes the same FOV as an FOV of a target image. Typically, in sensitivity distribution measurement, a sensitivity distribution image is acquired at an FOV greater than the FOV of the target image, and thus the FOV of the sensitivity distribution image is made to match the FOV of the target image. However, the sensitivity distribution image is a low-resolution image of which an image matrix size is smaller than that of the target image.

Then, the multi-coil image combining unit 212 combines Smap image data of respective channels to obtain one sheet of composite Smap image (S1514).

When combining the Smap image data of the respective channels, noise removal processing may be performed to improve an SNR (signal-to-noise ratio) of the Smap image that is a low-resolution image (S1513). As the noise removal processing, for example, a filtering method (guided filtering method) in which an SoS image, in which a sum-of-square of pixel values is taken as a pixel value, is set as a guide image, or the like can be employed. The method can be effectively applied to a low-resolution image of the head which is likely to have a low SNR, and can obtain highly accurate composite Smap image. However, the noise removal processing is not limited to the filtering method, and a known method can be employed, and the noise removal processing can be omitted.

The combining processing of the Smap image data by the multi-coil image combining unit 212 can be expressed by the following Expression (1).

[Math. 1]

$$S_{MAC} = \Sigma_{i=1}^{n} C_i \times S_i \quad (1)$$

In the expression, $S_{MAC}$ represents a composite Smap image, Ci represents a coil sensitivity distribution of an $i^{th}$ channel, Si represents an Smap image of the $i^{th}$ channel, and "i" of Ci and Si represents any one of 1 to n in a case where the number of channels is n. Here, Ci represents a coil sensitivity map calculated for multiple coil combining, and can be temporarily calculated by the following Expression (2).

[Math. 2]

$$C_i = \frac{S_i \exp(-i\phi_{ref})}{S_{SoS}} \quad (2)$$

In the expression, $S_{SoS}$ is the same as the sum-of-square SoS image used as the guide image of the filtering. In addition, $\phi_{ref}$ in "exp" represents a phase image of a reference channel, and this term is added to obtain a sensitivity map including a phase difference with the reference channel as phase information. The reference channel is not particularly limited, but a channel of which a signal value becomes the maxim is preferable.

The combining processing S151 is completed by the processing S1511 to the processing S1514.

(Fourier Transform S152)

The fourier transform unit 213 performs fourier transform on the composite Smap image obtained in the combining processing S151 by the multi-coil image combining unit 212, and the resultant image is set as data of a frequency space, that is, a k-space.

(Frequency Component Calculation S153)

The sensitivity distribution frequency component calculation unit 214 calculates a sensitivity distribution frequency component from the k-space data of the composite Smap image ($S_{MAC}$). First, the sensitivity distribution frequency components will be described.

In an actual space, when a vector of each position on the actual space is set as "r", each channel image Si(r) is expressed by the product of a sensitivity distribution Ci(r) of each coil and a composite Smap image $S_{MAC}$ (r) as illustrated by Expression (3).

[Math. 3]

$$S_i(r) = C_i(r) \times S_{MAC}(r) \quad (3)$$

When both sides of Expression (3) are converted into k-space data, a relationship of Expression (3) is expressed by convolution integration in Expression (4).

[Math. 4]

$$S_i(k) = c_i(k) \otimes S_{MAC}(k) \quad (4)$$

In the expression, k represents a k-space position vector (the same shall apply hereinafter).

As expressed by Expression (4), $S_i(k)$ is a convolution of $S_{MAC}(k)$ and a sensitivity distribution frequency component $c_i(k)$. Here, $S_{MAC}$ (k) is obtained by converting an actual space image into k-space data, and a luminance value difference between pixels, that is, a shape or a structure of a subject is expressed as a frequency. However, $c_i(k)$ is a frequency component common to respective positions of the k-space, and does not depend on the shape or the structure of the subject. Accordingly, the sensitivity distribution frequency component $c_i(k)$ that does not depend on the shape or the structure of the subject is obtained by solving Expression (4).

Figure 8:
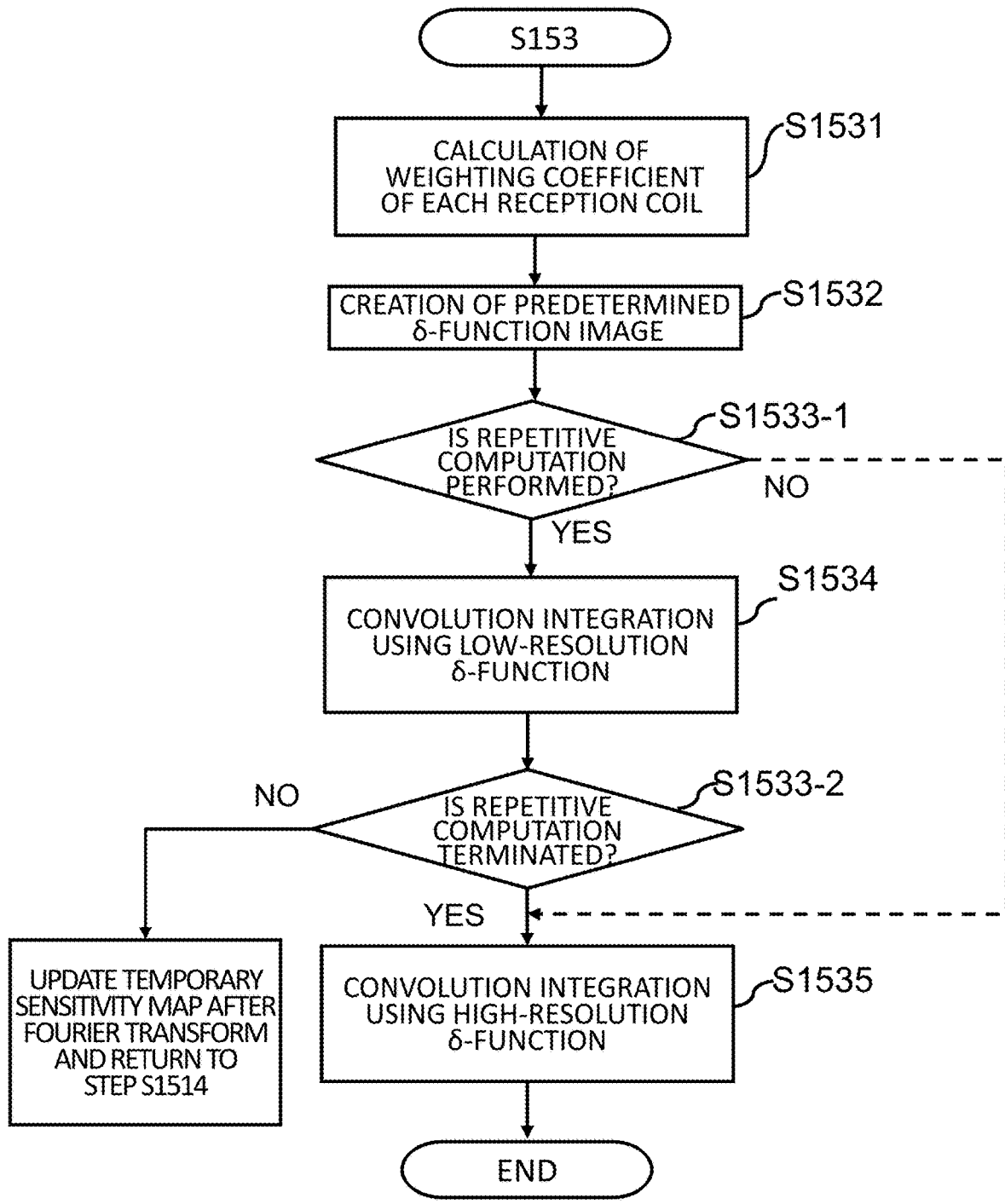
FIG. 8 is a view illustrating details of a frequency component calculation step S153 in the flow illustrated in FIG. 5.

Specifically, as illustrated in FIG. 8, processing of calculating the sensitivity distribution frequency component $c_i(k)$ include a step of calculating a weighting coefficient (kernel) corresponding to a frequency component of a reception coil (S1531), steps of convolution-integrating the weighting coefficient and a δ-function (S1534 and S1535), and a step of calculating the δ-function used in the convolution integration (S1532). In a flow illustrated in FIG. 8, to raise accuracy of the sensitivity distribution calculation, repetitive computation (S1533) is performed, and a mask processing step (S1536) of removing a region where a subject does not exist (S1536) is added. Note that, the repetitive computation may also be omitted.

First, description will be given of calculation of a weighting coefficient (S1531).

Expression (4) can be expressed as in Expression (5) by using a weighting coefficient of a predetermined kernel size.

[Math. 5]

$$S_i(k_x,k_y) = \sum_{b_x=-B_x}^{B_x} \sum_{b_y=-B_y}^{B_y} w_i(b_x,b_y) S_{MAC}(k_x+b_x,k_y+b_y) \quad (5)$$

Expression (5), kx and ky represent a k-space position, bx and by represent a k-space position in the kernel, and Bx and By represent a kernel size. The kernel size is not particularly limited, and is set, for example, to a small size such as 5×5 and 9×9.

Expression (5) becomes Expression (6) in matrix expression, and a weight vector wi (that is, a weighting coefficient) can be calculated from a pseudo-inverse matrix expressed by Expression (7).

[Math. 6]

$$S_i = S_{MAC} w_i \quad (6)$$

[Math. 7]

$$w_i = (S_{MAC}{}^H S_{MAX})^{-1} S_{MAC}{}^H s_i \quad (7)$$

Note that, when a size of the Smap image is set as Nx and Ny (provided that, Nx and Ny are even numbers), in the case of the kernel size is an odd number, a size of a matrix $S_{MAC}$ satisfies the following relationship.

(Vertical,Horizontal)={(Nx−Bx+1)×(Ny−By+1),Bx×By}

As illustrated in Expression (8), the convolution integration unit 216 convolution-integrates the δ-function having a desired size to the weighting coefficient wi obtained as described above, thereby obtaining the sensitivity distribution frequency component $c_i(k)$ illustrated in Expression (4) (S1534 or S1535). That is, the weighting coefficient is a sensitivity distribution frequency component, but a kernel size thereof is small, and thus the δ-function having a desired size is subjected to convolution integration to perform extrapolation in the k-space, thereby obtaining a frequency component having a desired size.

[Math. 8]

$$c_{i(k)} = w_i(b) \times \delta_L(k) \quad (8)$$

According to this, the δ-function image calculation unit 215 creates an image in which all pixel values in a desired size are set to 1, and fourier-transforms the image to create the δ-function having a desired size (S1532). For example, in a case where a size of a low-resolution composite Smap image $S_{MAC}$ is 64×64, an image (pixel value=1) of the size of 64×64 is fourier-transformed to create δ-function of 64×64. Here, a slice (2D data) is set as a target, and thus a two-dimensional δ-function is created. In the flow illustrated in FIG. 8, in the case of omitting repetitive computation, a δ-function that matches a size of a high-resolution image in main imaging is created, and the δ-function may be used in Expression (8) as indicated by an dot-line arrow in FIG. 8 (S1535).

In the case of performing the repetitive computation ("YES" in S1533-1), in step S1534, after calculating sensitivity distribution frequency components by using the low-resolution δ-function, the frequency components are substituted with the sensitivity map (virtual sensitivity map obtained by Expression (2)) used in Expression (1) when combining the Smap image of each channel to create a composite Smap image again (S1514), and the subsequent processing (S152 and S153) is repeated. By repeating the processing, it is possible to raise accuracy of a finally obtained sensitivity map.

For example, termination of the repetition (S1533-2) may be set to a point of time at which a difference between the square of a sensitivity map obtained last time and the square of a sensitivity map obtained this time, or a variation ratio expressed by the following Expression (9) becomes equal to or less than a predetermined threshold value, or the number of times of repetitions may be set as a termination condition.

[Math. 9]

$$\sqrt{\frac{\sum\{(c_i^m - c_i^{m-1})^2\}}{\sum(c_i^{m-1})^2}} \leq a \quad (9)$$

In Expression (9), represents a predetermined threshold value, for example, "0.01", and "m" represents $m^{th}$ repetition.

After repetition is terminated, high-resolution sensitivity distribution frequency components are calculated by using the δ-function that matches the size of a high-resolution image in the main imaging (S1535).

(Conversion to Actual Space: S154, and Mask Multiplication: S155)

Finally, the sensitivity distribution frequency components obtained in step S1535 are fourier-transformed to obtain a sensitivity distribution (sensitivity map) that is actual space data. Then, multiplication by a predetermined mask image is performed to remove a noise near the sensitivity distribution. The mask image multiplication unit 217 creates a mask image from the low-resolution image acquired as the sensitivity distribution image, and multiplies the mask image and the sensitivity distribution image after fourier transform together. Note that, creation of the mask image can be created at any time after cutting out a slice form the 3D sensitivity image (FIG. 7: 1512).

Figure 9:
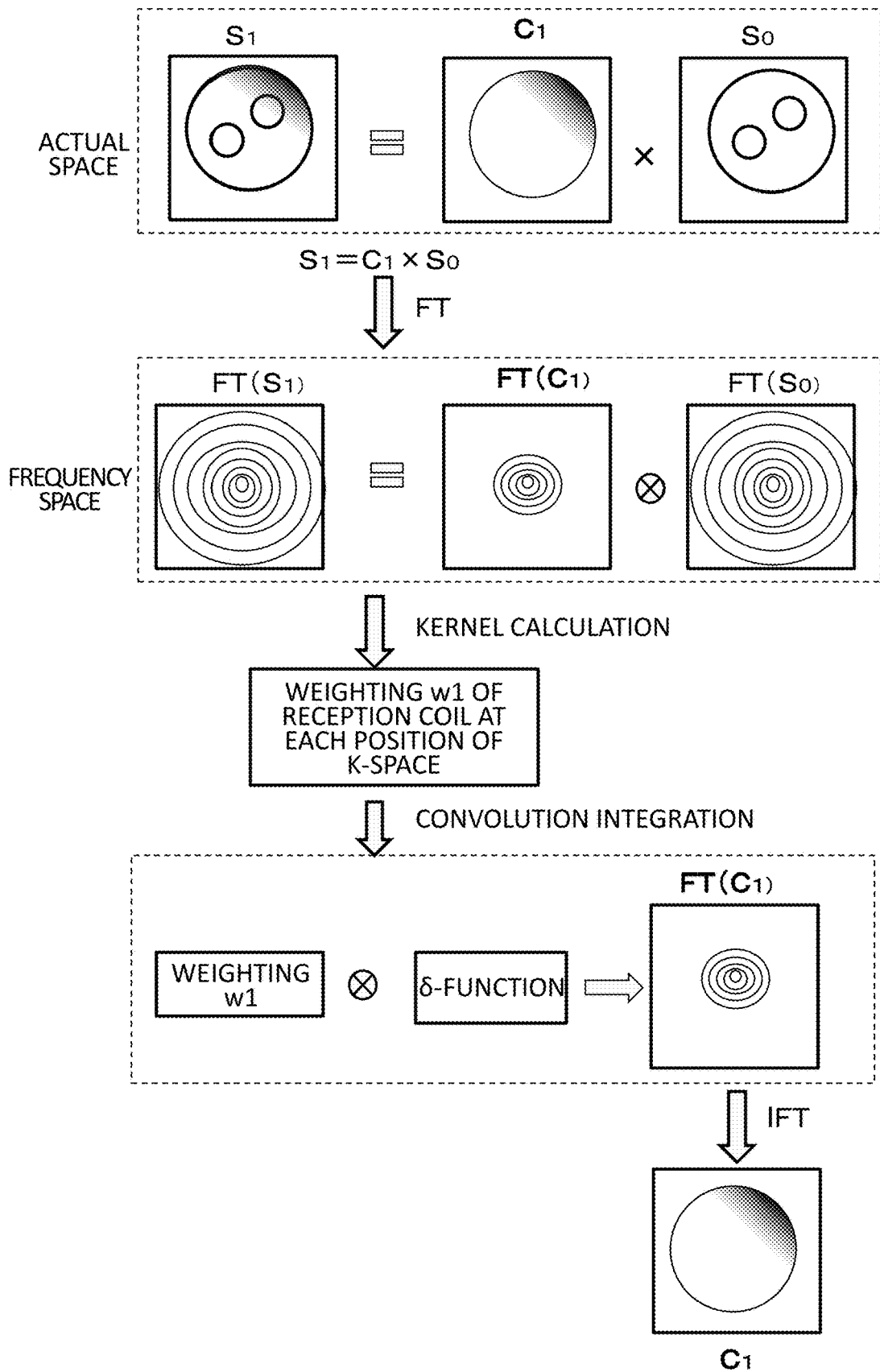
FIG. 9 is a view illustrating processing in the first embodiment.
Figure 10:
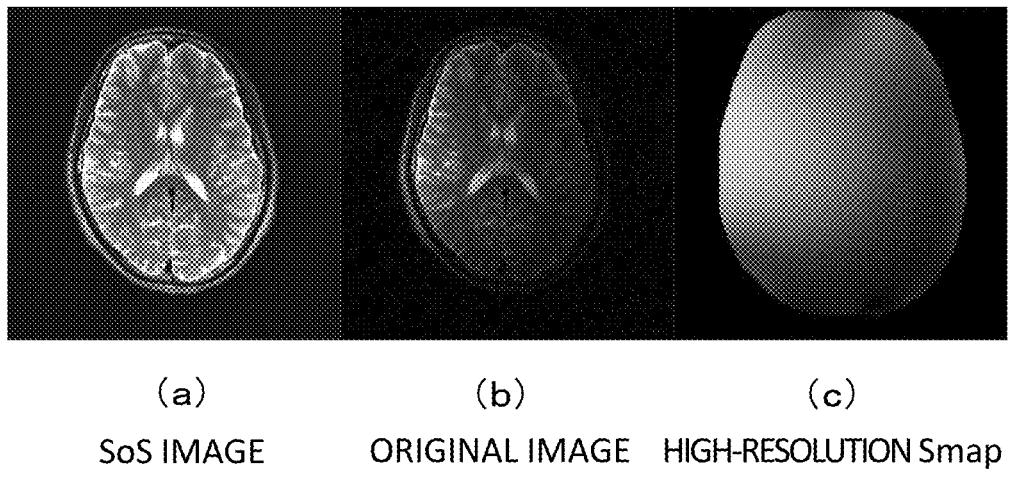
FIG. 10 is a view illustrating a high-resolution sensitivity distribution obtained by the first embodiment.

The sensitivity distribution calculation processing S1002 in FIG. 3 is terminated by S151 to S154 described above. FIG. 9 schematically illustrates processing of this embodiment. In addition, FIG. 10 illustrates a high-resolution sensitivity distribution image that is actually calculated from an image of the human head by using the reception coil in which the number of channels is five according to this embodiment. In FIG. 10, (a) illustrates an SoS image in which a sum-of-square of pixel values of images of respective channels is taken as a pixel value, (b) illustrates an image of one channel, and (c) illustrates a sensitivity distribution (after mask multiplication) of the same channel.

[Signal Separation Step S1003, and Image Display Step S1004]

In accordance with execution of a main imaging sequence, with respect to an image obtained by each reception coil, the image generation unit 23 (FIG. 1) performs signal separation (removal of aliasing) computation by using each reception coil sensitivity distribution calculated in the sensitivity distribution calculation processing and by using a known parallel imaging algorithm, thereby obtaining a subject image. In this embodiment, the sensitivity distribution is obtained for every slice, and thus in a case where an image obtained in the main imaging sequence is a 3D image, the signal separation processing is performed for every slice with respect to an image of a corresponding slice position. In the case of a multi-slice image, in the slice cutting (S1512), the same slice position as in the main imaging slice is cut out to perform the sensitivity distribution calculation, and with respect to each slice of a corresponding multi-slice image, the signal separation processing is performed by using a sensitivity distribution of a corresponding slice position.

The computation unit 20 can cause, for example, the display 110 of the user interface device 40 to display the subject image, or can cause a display in a location spaced apart from the MRI apparatus to display the subject image through communication or the like.

As described above, according to this embodiment, first, sensitivity distribution images of respective reception coils and a composite sensitivity distribution image obtained by combining the sensitivity distribution images are set as k-space data, sensitivity distribution frequency components of the reception coils are obtained, and convolution computation using the δ-function having a desired size is performed with respect to the frequency components. According to this it is possible to obtain a high-resolution sensitivity distribution image in which an influence of a shape or a structure of a subject is eliminated. As a result, accuracy of signal separation processing on actual space by using the reception coil sensitivity distribution is raised, and thus parallel imaging with accuracy can be performed.

In addition, in this embodiment, the sensitivity distribution (2D-sensitivity distribution) for every slice is calculated, and thus the design of an optical kernel that is used in sensitivity distribution calculation becomes easy. In addition, the signal separation processing can be performed with respect to only a desired slice among images in the main imaging, and thus the signal separation processing is realized by simple computation.

Modification Example 1

In the first embodiment, description has been given of an example in which the invention is applied to parallel imaging in which k-space data is tinned out and is measured, but the sensitivity distribution calculation method of the first embodiment is applicable to imaging (MAC combining) in which data is measured without being thinned out, and combining is performed by multiplying images of a plurality of channels and a sensitivity distribution together. In this case, the signal separation processing (S1003) in FIG. 3 is substituted with signal combining processing.

Even in this modification example, since high-accuracy high-resolution sensitivity distribution is used, it is possible to improve accuracy of a composite image.

Modification Example 2

In the first embodiment, the measurement unit 10 acquires the 3D-Smap image as the sensitivity distribution image, a slice (2D image data) is cut out from the image data, and the 2D sensitivity distribution is calculated. However, the measurement unit 10 may acquire a plurality of 2D-Smap images by multi-slice imaging, and may calculate the 2D sensitivity distribution with respect to each or parts of slices. An overview of the processing in the first embodiment and the modification example is collectively illustrated in FIG. 11. In the drawing, the method of the first embodiment is illustrated in a state of being surrounded by a dotted line, and the method of the modification example is illustrated in a state of being surrounded by a one-dot chain line.

In the case of cutting out the slice from the 3D-Smap image, the degree of freedom of a slice to be cut out is high.

In this modification example, the slice cutting unit 211 in FIG. 6 and step S1512 (step of cutting out a slice from the 3D image data of each channel) in FIG. 5 are not necessary, and thus it is possible to reduce sensitivity distribution calculation load.

Second Embodiment

In the first embodiment, the 2D-sensivity distribution is calculated for every slice from the measured 3D-sensitivity distribution image data or the 2D-sensitivity distribution image data, but this embodiment is characterized in that the three-dimensional sensitivity distribution is acquired by processing performed once.

The processing of calculating the three-dimensional sensitivity distribution is applicable to any of a case where the sensitivity distribution image obtained in the sensitivity distribution sequence is 3D-data and a case where the sensitivity distribution image is multi-slice 2D-data. However, here, description will be given of the case of the 3D-data as in the first embodiment. FIG. 5 and FIG. 7 will be appropriately referred to.

First, the 3D-sensitivity distribution sequence (for example, the pulse sequence in FIG. 4) is executed to obtain the 3D-sensitivity distribution image data (Smap image), and the 3D-sensitivity distribution image data is combined to obtain a 3D-composite sensitivity distribution image (combining step S151). In this embodiment, in the combining step S151 illustrated in FIG. 7, the slice cutting step (FIG. 7: S1512) for acquiring 3D data sensitivity distribution is not necessary. In addition, combining performed by using a virtual sensitivity distribution uses the 3D sensitivity distribution instead of the sensitivity distribution for every slice.

Next, the 3D-composite sensitivity distribution image is fourier-transformed (S152), and a weighting coefficient wi of each reception coil in the k-space is calculated from the following Expressions (10) to (12). Expressions (10) to (12) respectively correspond to Expressions (5) to (7) described in the first embodiment, as k-space data of each reception coil, data obtained by convolution integration of the weighting coefficient and k-space data of a composite sensitivity distribution image is used, and a 3D weighting coefficient (kernel function) is obtained by pseudo-inverse matrix computation.

[Math. 10]

$$s_i(k_x, k_y, k_z) = \sum_{b_x=-B_x}^{B_x} \sum_{b_y=-B_y}^{B_y} \sum_{b_z=-B_z}^{B_z} w_i(b_x, b_y, b_z)s_{MAC}(k_x+b_x, k_y+b_y, k_z+b_z) \quad (10)$$

[Math. 11]

$$s_i = S_{MAC}w_i \quad (11)$$

[Math. 12]

$$w_i = \left(S_{MAC}^H S_{MAC}\right)^{-1} S_{MAC}^H s_i \quad (12)$$

Here, when a size of an Smap image is set as $N_x$, $N_y$, and $N_z$ (even numbers), a size of a matrix $S_{MAC}$ satisfies the following relationship.

(Vertical,Horizontal)=$((N_x-B_x+1)\times(N_y-B_y+1)\times(N_z-B_z+1),B_x\times B_y\times B_z)$(when a kernel size is an odd number)

Then, convolution integration of the 3D weighting coefficient and the δ-function is performed to obtain frequency components of a sensitivity distribution having a desired size. The δ-function is a 3D function in which an image that creates the function is a 3D image and which has the same size as that of the image. A result of the convolution integration is fourier-transformed to obtain a sensitivity distribution that is actual space data. Even in the course of the sensitivity distribution calculation, kernel calculation and convolution integration processing may be repeated by using a low-resolution δ-function so as to improve accuracy of a sensitivity distribution to be finally obtained, or in a state in which the accuracy is raised through the repetition, final convolution integration may be performed by using a high-resolution δ-function to obtain a sensitivity distribution.

According to this embodiment, the difficulty of designing an optimal kernel in step S1531 becomes higher in comparison to the case of obtaining the 2D sensitivity distribution for every slice (first embodiment), but there is no concern that a deviation between slices occurs, and it is possible to obtain smooth sensitivity distribution.

Note that, in this embodiment, the sensitivity distribution image data obtained by the measurement unit 10 is 3D-data. However, even in a case where the sensitivity distribution image data is 2D-data, when treating the multi-slice data as the 3D-data, it is possible to calculate the 3D-sensitivity distribution in processing performed once (Modification Example 1). In addition, a plurality of predetermined slices corresponding to the main imaging may be cut out from the 3D-data and may be treated as the 3D-data, and the 3D-sensitivity distribution may be calculated in processing performed once (Modification Example 2). The processing of this embodiment and the modification examples is illustrated in FIG. 11 illustrating the overview of the processing of the modification example in the first embodiment. In the drawing, the processing of this embodiment and the modification examples thereof is indicated by an L-shaped arrow.

Third Embodiment

In the first and second embodiment, the sensitivity distribution sequence is performed separately from the main imaging sequence, but the sensitivity distribution calculation may be performed by using a part of measurement data obtained in the main imaging sequence (self-calibration).

Figure 12:
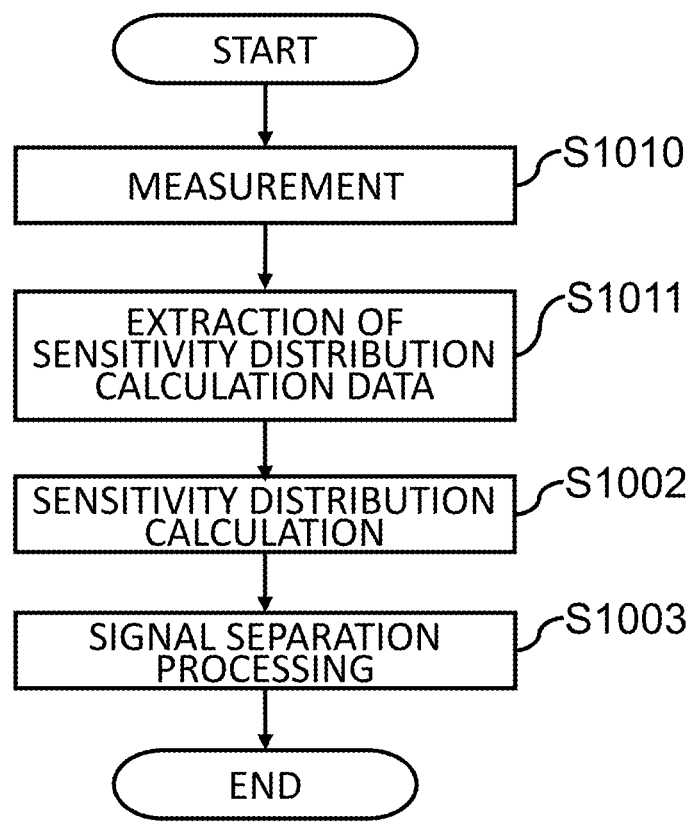
FIG. 12 is a view illustrating an imaging procedure in a third embodiment.

Processing of this embodiment is illustrated in FIG. 12. In FIG. 12, the same processing as in FIG. 3 is indicated by the same reference numeral, and description thereof will be omitted. Processing of this embodiment is similar to the processing in the first or second embodiment except that measurement data in the main imaging is used in sensitivity distribution calculation, and thus the processing of the modification examples described in the first embodiment or the second embodiment is also applicable to this embodiment.

In the processing of this embodiment, in measurement S1010, the sensitivity distribution sequence is omitted, and only the main imaging sequence is executed. At this time, a low-frequency region data is measured without being thinned out. The low-frequency region data measured without being thinned out is extracted (S1011), and is used in the sensitivity distribution calculation (S1003). For example, the low-frequency region represents data with low resolution of approximately several lines of a low-frequency region including the origin of the k-space, and is data having resolution similar to that of the data acquired in the sensitivity distribution sequence in the first embodiment. Then, sensitivity distribution calculation (S1002), signal separation (S1003), and appropriate image display are similar to the first embodiment.

Even in this embodiment, as illustrated in FIG. 11, in the sensitivity distribution calculation, 2D sensitivity distribution may be calculated by using 3D image data or 2D image data, or 3D sensitivity distribution may be calculated by using the image data. Any one appropriate method may be employed in correspondence with the main imaging sequence.

According to this embodiment, the self-calibration is performed, and thus time taken for the sensitivity distribution measurement is not necessary. As a result, it is possible to reduce an influence of body movement.

Hereinbefore, respective embodiments of the invention have been described, but the invention is not limited to the embodiments as long as an apparatus is provided with means for realizing sensitivity distribution computation in a frequency space, and elements may be added to structures or processes illustrated in the drawings, or a part of elements may be omitted.

In addition, the invention is applicable to not only the parallel imaging in which k-space data is thinned out, but also multiple-slice selection excitation (SMS) parallel imaging or combining of a plurality of channel images (MAC combining). In typical MAC combining, the sum-of-square of the sensitivity distribution is used, and thus phase information disappears. However, when using the sensitivity distribution obtained by the method according to the embodiments, it is possible to obtain an image (complex image) having phase information.

REFERENCE SIGNS LIST

10 Measurement unit
20 Computation unit
21 Sensitivity distribution calculation unit
23 Image generation unit
30 Control unit
40 User interface
211 Slice cutting unit
212 Multi-coil image combining unit
213 Fourier transform unit
214 Sensitivity distribution frequency component calculation unit
215 δ-function image calculation unit
216 Convolution integration unit
217 Mask image multiplication unit

The invention claimed is:
1. A magnetic resonance imaging apparatus comprising:
a measurement unit that includes a reception coil having a plurality of channels, and measures a nuclear magnetic resonance signal of a subject for each of the channels of the reception coil; and
an image computation unit that creates an image of the subject by using a sensitivity distribution for each channel of the reception coil and a channel image of plural channel images obtained from the nuclear magnetic resonance signal measured by the measurement unit for each channel,
wherein the image computation unit includes a sensitivity distribution calculation unit that calculates a sensitivity distribution on a k-space for each channel by using the channel images and a composite image obtained by combining the channel images, wherein the calculated sensitivity distribution does not depend on a shape or a structure of the subject, and
wherein the sensitivity distribution calculation unit:
obtains the composite image by:
performing a Fourier transform to convert k-space data into image data,
cutting out slices of the image data for each channel, and
combining the cut out slices to generate the composite image,
after calculating the composite image:
converts the channel images and the composite image into k-space data, and
calculates a sensitivity distribution frequency component from the k-space data of the composite image by:
calculating a weighting coefficient corresponding to a respective frequency component of a reception coil, and
convolution-integrating the weighting coefficient and a δ-function, and an actual space conversion unit that converts the frequency component after the convolution integration into actual space data.

2. The magnetic resonance imaging apparatus according to claim 1,
wherein the sensitivity distribution calculation unit calculates a sensitivity distribution by using a low-resolution image for each channel which is measured by the measurement unit.

3. The magnetic resonance imaging apparatus according to claim 1,
wherein the sensitivity distribution calculation unit calculates a sensitivity distribution by using low-frequency region data in a high-resolution image for each channel which is measured by the measurement unit.

4. The magnetic resonance imaging apparatus according to claim 1,
wherein the convolution integration unit uses a δ-function corresponding to an imaging field of view and resolution of an image measured by the measurement unit as the δ-function.

5. The magnetic resonance imaging apparatus according to claim 1,
wherein the sensitivity distribution calculation unit calculates a sensitivity distribution for every two-dimensional slice cut out as a slice image from a three-dimensional image that is the channel image.

6. The magnetic resonance imaging apparatus according to claim 1,
wherein the sensitivity distribution calculation unit calculates three-dimensional sensitivity distribution in processing performed once.

7. A sensitivity distribution calculation method for a magnetic resonance imaging apparatus having a measurement unit that includes a reception coil having a plurality of channels, and measures a nuclear magnetic resonance signal of a subject for each of the channels of the reception coil, comprising:
a step of creating an image of a subject by using a sensitivity distribution for each channel of the reception coil and a channel image of plural channel images obtained from the nuclear magnetic resonance signal measured for each channel, wherein the sensitivity distribution does not depend on a shape or a structure of the subject;
a step of creating a composite image by performing a Fourier transform to convert k-space data into image data, and cutting out slices of the image data for each channel and then combining the cut out slices to generate the composite image;
a step of, after creating the composite image, converting the channel images and the composite image into k-space data;
a step of calculating a sensitivity distribution frequency component from the k-space data of the composite image by:
calculating a weighting coefficient corresponding to a respective frequency component of a reception coil, and
convolution-integrating the weighting coefficient and a δ-function, and
a step of converting data after the convolution integration into actual space data.

8. The sensitivity distribution calculation method according to claim 7,
wherein the sensitivity distribution is calculated for every slice.

9. The sensitivity distribution calculation method according to claim 7,
wherein the convolution integration step includes a step of convolution-integrating a low-resolution δ-function, and a step of convolution-integrating a high-resolution δ-function, and
the step of creating the composite image to the convolution integration step are repeated a plurality of times while updating the sensitivity distribution that is used in the composite image creation step, and the processing proceeds to the step of convolution-integrating the high-resolution δ-function.

10. A non-transitory computer readable medium with an executable sensitivity distribution calculation program stored thereon that causes a computer coupled to a magnetic resonance imaging apparatus having a measurement unit that includes a reception coil having a plurality of channels, and that measures a nuclear magnetic resonance signal of a subject for each of the channels of the reception coil, to execute steps comprising:
a step of creating an image of a subject by using a sensitivity distribution for each of the channels of the reception coil and a channel image of plural channel images obtained from the nuclear magnetic resonance signal measured for each of the channels, wherein the calculated sensitivity distribution does not depend on a shape or a structure of the subject;
a step of creating a composite image by performing a Fourier transform to convert k-space data into image data, and cutting out slices of the image data for each channel and then combining the cut out slices to generate the composite image;
a step of, after creating the composite image, converting the channel images and the composite image into k-space data;
a step of calculating a sensitivity distribution frequency component from the k-space data of the composite image by:
calculating a weighting coefficient corresponding to a respective frequency component of a reception coil, and
convolution-integrating the weighting coefficient and a δ-function, and
a step of converting data after the convolution integration into actual space data.

* * * * *